United States Patent
Nagao et al.

(10) Patent No.: US 10,513,877 B2
(45) Date of Patent: Dec. 24, 2019

(54) PINCHING DETECTION DEVICE

(71) Applicant: KABUSHIKI KAISHA TOKAI RIKA DENKI SEISAKUSHO, Aichi (JP)

(72) Inventors: Takashi Nagao, Aichi (JP); Tatsuya Suzuki, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 123 days.

(21) Appl. No.: 15/743,036

(22) PCT Filed: Jul. 8, 2016

(86) PCT No.: PCT/JP2016/070245
§ 371 (c)(1),
(2) Date: Jan. 9, 2018

(87) PCT Pub. No.: WO2017/026212
PCT Pub. Date: Feb. 16, 2017

(65) Prior Publication Data
US 2018/0355654 A1    Dec. 13, 2018

(30) Foreign Application Priority Data
Aug. 7, 2015  (JP) .................... 2015-157322

(51) Int. Cl.
```
E05F 15/46      (2015.01)
B60J 1/00       (2006.01)
E05F 15/695     (2015.01)
H03K 17/955     (2006.01)
H03K 17/96      (2006.01)
```
(52) U.S. Cl.
CPC .............. *E05F 15/46* (2015.01); *B60J 1/00* (2013.01); *E05F 15/695* (2015.01);
(Continued)

(58) Field of Classification Search
CPC ........ G01V 3/088; E05F 15/46; E05F 15/695; B60J 1/00; H03K 17/955;
(Continued)

(56) References Cited

U.S. PATENT DOCUMENTS

| | | | |
|---|---|---|---|
| 7,046,129 B2 * | 5/2006 | Regnet | ............. B60J 10/00 340/426.27 |
| 7,984,655 B2 * | 7/2011 | Ogawa | ................. E05F 15/46 73/780 |

(Continued)

FOREIGN PATENT DOCUMENTS

| | | | |
|---|---|---|---|
| JP | 10-110574 | | 4/1998 |
| JP | H10110574 | * | 4/1998 |

(Continued)

OTHER PUBLICATIONS

International Search Report, dated Sep. 27, 2016 from the Japan Patent Office (JPO), in the corresponding International Application No. PCT/JP2016/070245.

(Continued)

*Primary Examiner* — Octavia Hollington
(74) *Attorney, Agent, or Firm* — Greenblum & Bernstein, P.L.C.

(57) ABSTRACT

This pinching detection device of a power window is provided with: a sensor electrode provided in a windowpane; a position-detecting electrode that opposes the sensor electrode; and a control unit. The size of an opposing surface area between the sensor electrode and the position-detecting electrode increases as the windowpane is raised. The control unit detects pinching of foreign matter on the basis of a change in capacitance in the sensor electrode and detects a position in the windowpane on the basis of the change in capacitance.

9 Claims, 2 Drawing Sheets

(52) U.S. Cl.
CPC ........ *H03K 17/955* (2013.01); *E05Y 2400/58* (2013.01); *E05Y 2900/55* (2013.01); *H03K 2017/9604* (2013.01); *H03K 2217/96078* (2013.01)

(58) Field of Classification Search
CPC ... H03K 2017/9604; H03K 2217/9078; H03K 2217/96078; E05Y 2400/58; E05Y 2900/55
USPC .......................................................... 73/780
See application file for complete search history.

(56) References Cited

U.S. PATENT DOCUMENTS

| | | | | |
|---|---|---|---|---|
| 8,720,279 B2 * | 5/2014 | Ogawa | ................. | H03K 17/955 324/658 |
| 2011/0210755 A1 | 9/2011 | Ogawa | | |

FOREIGN PATENT DOCUMENTS

| | | |
|---|---|---|
| JP | 2005-314949 | 11/2005 |
| JP | 5505972 | 5/2014 |

OTHER PUBLICATIONS

International Preliminary Report on Patentability (English language translation), dated Feb. 13, 2018, in the corresponding International Application No. PCT/JP2016/070245.

* cited by examiner

PINCHING DETECTION DEVICE

TECHNICAL FIELD

The present invention relates to an entrapment detection device.

BACKGROUND ART

Patent document 1 discloses an entrapment detection device for a door window that is opened and closed by a motor. The entrapment detection device includes an electrostatic sensor that includes an electrode arranged on the door window. If the electrostatic sensor detects entrapment of an object during a closing operation of the door window, the rotation or the motor is automatically reversed to open the door window. This frees the entrapped object.

PRIOR ART DOCUMENT

Patent Document 1: Japanese Laid-Open Patent Publication No. 2005-314949

SUMMARY OF THE INVENTION

The entrapment detection device of patent document 1 includes a pulse generator, which is arranged on the motor to generate a pulse corresponding to rotation of the motor, and a position determination circuit, which determines the position of the door window by counting pulses generated by the pulse generator.

However, the pulse generator and the related wiring increase the number of components in the entrapment detection device and a power window. This may result in enlargement of the entrapment detection device and/or the power window.

It is an object of the present invention to provide an entrapment detection device that reduces the number of components.

One aspect of the present invention provides an entrapment detection device that is used with an opening-closing body movable in a movement direction and includes a sensor electrode located on the opening-closing body, a position detecting electrode opposed to the sensor electrode, and a detection unit. An opposing area between the sensor electrode and the position detecting electrode is increased in accordance with movement of the opening-closing body in the movement direction. The detection unit is configured to detect entrapment of an object from a change in electrostatic capacity of at least one of the sensor electrode and the position detecting electrode and also detect a position of the opening-closing body from the change in electrostatic capacity.

In this configuration, the electrostatic capacity, which is proportional to the opposing area of the two electrodes, is also increased in accordance with movement of the opening-closing body. This allows the detection unit to detect the position of the opening-closing body from the electrostatic capacity. More specifically, in the prior art, a pulse generator needs to be arranged on a driving source that supplies driving force to the opening-closing body. However, the need for a pulse generator is eliminated. Also, the need for wiring corresponding to the pulse generator is eliminated. Thus, the number of components in the entrapment detection device is reduced. This limits enlargement of the entrapment detection device and reduces the manufacturing steps.

In some implementations, one of the sensor electrode and the position detecting electrode includes a plurality of gaps opposed to the other one of the sensor electrode and the position detecting electrode. The plurality of gaps is arranged in the movement direction of the opening-closing body.

In this configuration, when the opening-closing body moves at a fixed speed, the rate of increase in the opposing area between the sensor electrode and the position detecting electrode is changed whenever the number of the gaps opposed to one of the sensor electrode and the position detecting electrode changes. Thus, the rate of increase in the electrostatic capacity also changes. This allows the detection unit to detect the position of the opening-closing body by counting the number of times the rate of increase in the electrostatic capacity is changed.

In some implementations, one of the sensor electrode and the position detecting electrode is arranged to shorten a distance between the sensor electrode and the position detecting electrode in accordance with movement of the opening-closing body in the movement direction.

It is known that electrostatic capacity is proportional to the opposing area of two electrodes and inversely proportional to the distance between the two electrodes. Hence, in this configuration, when the opposing area of the sensor electrode and the position detecting electrode is increased in accordance with the movement of the opening-closing body, the distance between the electrodes is shortened. Thus, the electrostatic capacity is increased in an accelerated manner. For example, a change in the position of the opening-closing body greatly changes the electrostatic capacity. This allows the detection unit to detect the position of the opening-closing body from the electrostatic capacity with higher accuracy.

Effect of the Invention

Some aspects of the present invention reduce the number of components in the entrapment detection device. Other aspects and advantages of the present invention will become apparent from the following description, taken in conjunction with the accompanying drawings, illustrating by way of example the principles of the invention.

EMBODIMENTS OF THE INVENTION

A vehicle power window including one embodiment of an entrapment detection device will now be described.

Figure 1A:
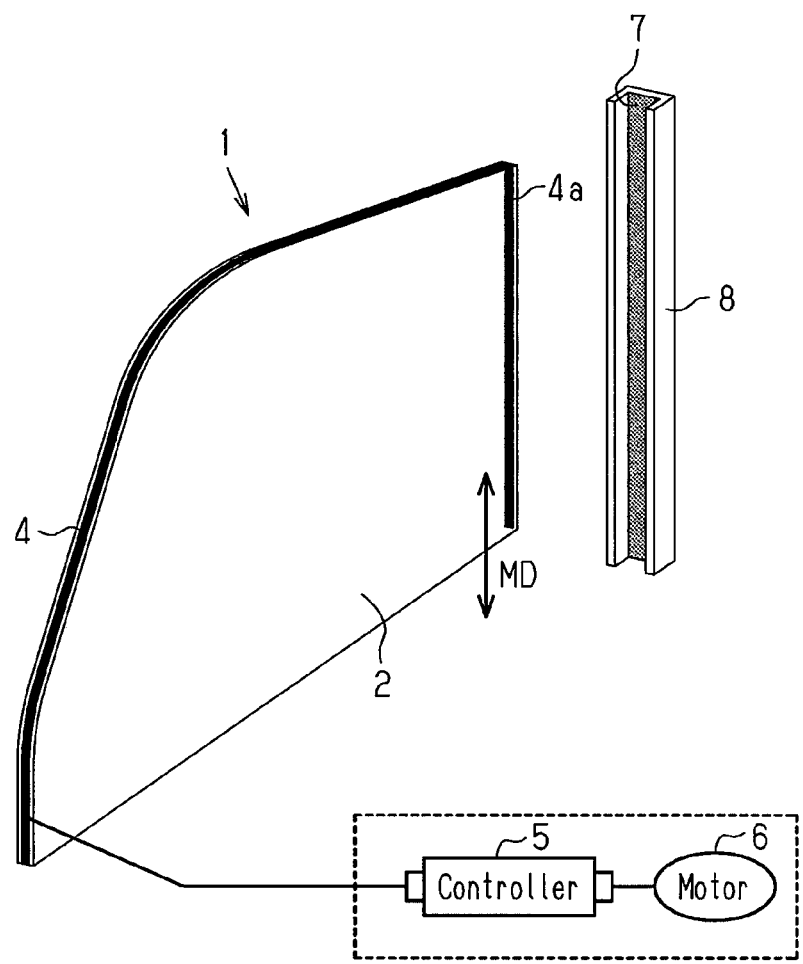
FIG. 1A is a diagram of a power window including an entrapment detection device.

As illustrated in FIG. 1A, a power window 1 includes a windowpane 2, a sensor electrode 4, a controller 5, a motor 6, and a position detecting electrode 7.

When the motor 6 is driven, the windowpane 2, which corresponds to an opening-closing body, moves within a window frame in a movement direction MD, which may be the vertical direction. The opening operation of the windowpane 2 lowers the windowpane 2. The closing operation of the windowpane 2 raises the windowpane 2.

The sensor electrode 4 is arranged on an end surface, or a thickness-wise surface, of the planar windowpane 2 that faces the window frame and may be exposed to the exterior. The sensor electrode 4 includes a strip portion, which is located on a rearward end surface of the windowpane 2 and functions as an opposing electrode 4a. The opposing electrode 4a may be referred to as a first elongated strip.

The position defecting electrode 1 is arranged at the rear of the windowpane 2 on a surface of a frame 8 opposed to the windowpane 2, more precisely, the rearward end surface of the windowpane 2. The frame 8 may be a portion of the window frame functioning as an exterior member. The position detecting electrode 7 is a strip of an electrode extending in the vertical direction and may be referred to as a second elongated strip. When the windowpane 2 is located in a movable range, the outermost surface of the opposing electrode 4a is opposed to at least a portion of the outermost surface of the position detecting electrode 7.

Figure 1B:
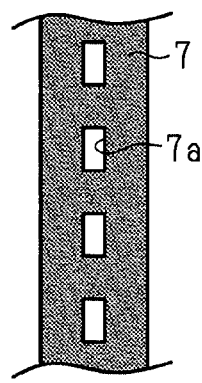
FIG. 1B is a front view of a position detecting electrode.

As illustrated in FIG. 1B, the position detecting electrode 7 includes a plurality of void portions 7a separated from each other in the longitudinal direction. The void portions 7a are, for example, tetragonal recesses. The void portions 7a are vertically arranged so that adjacent ones of the void portions 7a are separated from each other by a fixed or predetermined interval and preferably aligned in the vertical direction.

As illustrated in FIG. 1A, the controller 5 is electrically connected to the sensor electrode 4 and the motor 6. When the user operates an operation switch, which is not illustrated in the drawings, the operation switch provides an operation signal to the controller 5. The controller 5 drives the motor 6 to open or close the windowpane 2 in accordance with the operation signal from the operation switch.

The opening and closing operations of the windowpane 2 include a manual operation, which stops the movement of the windowpane 2 when the operation switch is released from the operation, and an automatic operation, which continues to move the windowpane 2 until the windowpane 2 reaches the fully-open position or the fully-closed position even if the operation switch is released from the operation. The automatic operation includes an operation that continues to lower the windowpane 2 to the fully-open position, which is referred to as "the auto-down operation," and an operation that continues to raise the windowpane 2 to the fully-closed position, which is referred to as "the auto-op operation." The raising and lowering of the windowpane 2 is always performed at a uniform speed.

The controller 5 may include one or more hardware processors functioning as a detection unit and constantly monitors changes in electrostatic capacity of the sensor electrode 4. If the controller 5 detects an increase in the electrostatic capacity of the sensor electrode 4 that exceeds a predetermined value during the raising of the windowpane 2 started by the auto-up operation, the controller 5 reverses the movement of the windowpane 2, that is, lowers the windowpane 2. This frees the object, such as a finger, entrapped between the windowpane 2 and the window frame.

The predetermined value, which is the determination reference that reverses movement of the windowpane 2, is predetermined in correspondence with positions of the windowpane 2. The controller 5 monitors changes in the electrostatic capacity of the sensor electrode 4 to determine the position of the windowpane 2. The determination of the position of the windowpane 2 will be described in the operation described below.

The operation of the power window 1 will now be described. When an electrode (here, sensor electrode 4) and an object, such as a finger, are located proximate to each other, a capacitor, the electrodes of which are the object and the sensor electrode 4, is formed with respect to ground. Consequently, the circuit is closed, and current flows between the object and the sensor electrode. This technique is known and thus will not be described in detail.

It is known that when a capacitor includes a dielectric located between two electrode plates, electrostatic capacity C of the capacitor is obtained from formula (1) where ε represents the permittivity of the dielectric, S represents the area in which the electrodes are opposed to each other, and d represents the distance between the electrodes.

$$C = \varepsilon \times S/d \tag{1}$$

Thus, the electrostatic capacity C is proportional to the opposing area S.

In the present example, the opposing electrode 4a of the sensor electrode 4 and the position detecting electrode 7 are opposed to each other and function as the electrodes of a capacitor formed therebetween with respect to ground. Additionally, the opposing area S of the opposing electrode 4a and the position detecting electrode 7 is increased in accordance with the raising of the windowpane 2. Thus, the electrostatic capacity of the sensor electrode 4 is increased in accordance with the raising of one windowpane 2.

Figure 2A:
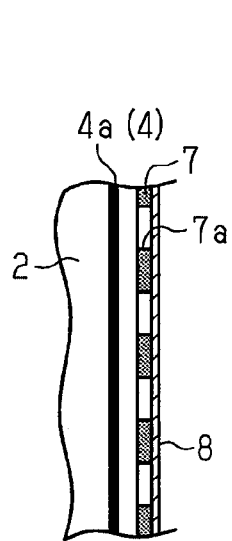
FIG. 2A is a cross-sectional view of the position detecting electrode and an opposing electrode.

As illustrated in FIG. 2A, the position detecting electrode 7 includes the void portions 7a arranged at equal intervals. Since she windowpane 2 is raised at the uniform speed, when the upper end of the opposing electrode 4a is traversing an opposing one of the void portions 7a, the opposing area S is slowly increased. When the upper end of the opposing electrode 4a is not opposed to the void portions 7a, the opposing area S is quickly increased. More specifically, the rate at which the opposing area S is increased in accordance with the raising of the windowpane 2 changes depending on whether or not the upper end of the opposing electrode 4a is opposed to the void portions 7a.

Figure 2B:
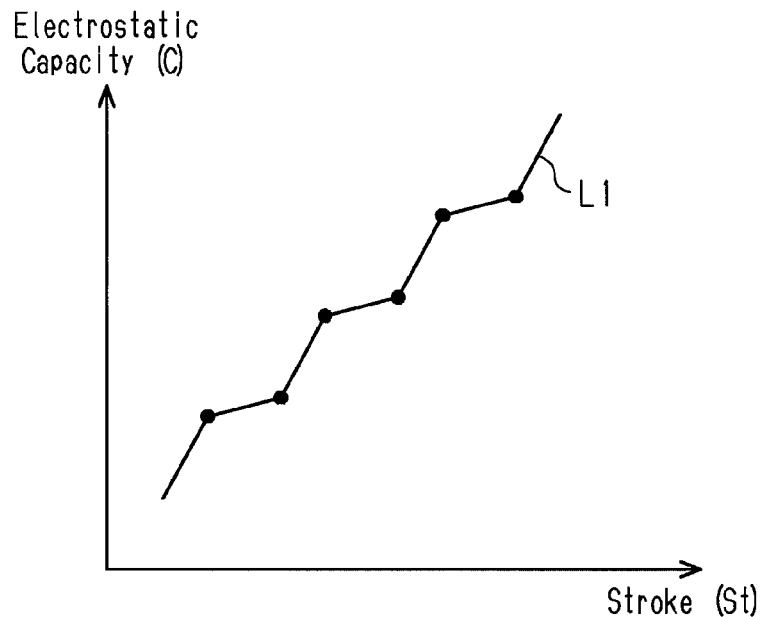
FIG. 2B is a graph showing the relationship between the position of a windowpane and electrostatic capacity.

In FIG. 2B, the horizontal axis represents a stroke St of the windowpane 2 from a lower end of the frame (e.g., position of upper end of windowpane 2), and the vertical axis represents the electrostatic capacity C. FIG. 2B shows a characteristic line L1 that is bent at positions indicated by black dots and includes straight parts having a relatively large inclination corresponding to a first electrostatic capacity increasing rate and straight parts having a relatively small inclination corresponding to a second electrostatic capacity increasing rate. Thus, the increasing rate of the electrostatic capacity C per unit movement amount of the windowpane 2, which is being raised at the uniform speed, is changed, for example, in a stepped manner depending on whether or not the upper end of the opposing electrode 4a is opposed to the void portions 7a.

The controller 5 determines the position of the windowpane 2 by counting the number of times the rate of increase in the electrostatic capacity C is changed. The controller 5 also changes the predetermined value, which is the determination reference that reverses the movement of the windowpane 2, in accordance with the position of the windowpane 2.

As described above, the entrapment defection device of the embodiment has the advantages described below.

(1) The opposing area between the opposing electrode 4a of the sensor electrode 4 and the position detecting electrode 7 is increased in accordance with the raising of the windowpane 2. Also, the electrostatic capacity C, which is proportional to the opposing area S between the electrodes, is increased in accordance with the raising of the windowpane 2. This allows the controller 5 to detect the position of the windowpane 2 from the electrostatic capacity C. Further, the controller 5 may change the predetermined value, which is the determination reference that reverses the movement of the windowpane 2, in accordance with the position of the windowpane 2.

This eliminates the need for the pulse generator, which needs to be arranged on the motor supplying driving force to the opening-closing body in the prior art. Also, the need for wiring corresponding to the pulse generator is eliminated. Thus, the number of components in the entrapment detection device and the power window 1 is reduced. This limits enlargement of the entrapment detection device and/or the power window 1 and reduces the manufacturing steps.

(2) The position detecting electrode 7 includes the void portions 7a, which are formed by partially boring the position detecting electrode 7 at predetermined intervals in the vertical direction. When the windowpane 2 is raised at the fixed speed, the rate of increase in the opposing area S between the opposing electrode 4a and the position detecting electrode 7 is changed whenever the number of the void portions 7a opposed to the opposing electrode 4a changes. This ultimately changes the rate of increase in the electrostatic capacity C. The controller 5 determines the position of the windowpane 2 by counting the number of times the rate of increase in the electrostatic capacity is changed.

The embodiment may be modified as follows.

Figure 3A:
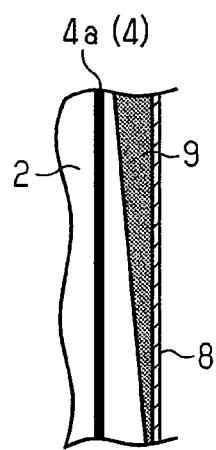
FIG. 3A is a cross-sectional view showing a modified example of a position detecting electrode and an opposing electrode.

FIG. 3A shows a modified example in which a position detecting electrode 9 is used instead of the position detecting electrode 7 of the embodiment. As illustrated in FIG. 3A, the position detecting electrode 9 may have, for example, a wedge-shaped cross section so that the thickness of the position detecting electrode 9 is gradually increased in the upward direction. Thus, the distance between the position detecting electrode 9 and the rearward end surface of the windowpane 2 is gradually shortened toward the upper side. The distance between the position detecting electrode 9 and the opposing electrode 4a is shortened in accordance with the raising of the windowpane 2.

Figure 3B:
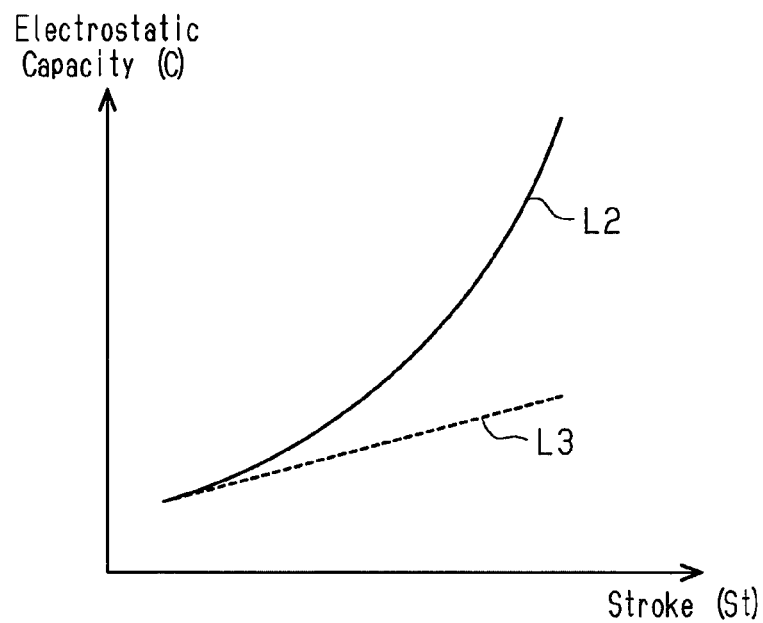
FIG. 3B is a graph showing the relationship between the position of a windowpane and electrostatic capacity.

As shown in formula (1), the electrostatic capacity C is proportional to the opposing area S between the electrodes and inversely proportional to the inter-electrode distance d. Thus, as illustrated in FIG. 3B by a characteristic line L2, the electrostatic capacity C of the modified example is increased greatly, for example, in an accelerated manner, in accordance with the raising of the windowpane 2. On the other hand, as illustrated in FIG. 3B by a characteristic line L3, in a reference example in which the position detecting electrode and the opposing electrode 4a are separated by a fixed distance, the electrostatic capacity C is increased relatively moderately, for example, linearly, in accordance with the raising of the windowpane 2. As described above, in the modified example illustrated in FIG. 3, the difference or change in the electrostatic capacity C caused by the position of the windowpane 2 is increased. This allows the controller 5 to detect the position of the windowpane 2 from the electrostatic capacity C with higher accuracy.

In the modified example of FIG. 3, the position detecting electrode 9 is arranged on the vertically stationary frame 8 so that the thickness of the position detecting electrode 9 is gradually increased in accordance with the raising of the windowpane 2. Instead, the opposing electrode 4a may be configured so that the thickness of the opposing electrode 4a is increased in accordance with the raising of the windowpane 2. More specifically, the opposing electrode 4a is arranged so that the thickness is gradually increased toward the lower side. This configuration may also have the same or corresponding advantage as the modified example of FIG. 3.

Here, one of the sensor electrode (opposing electrode) and the position detecting electrode has different thicknesses between the upper side and the lower side so that the distance from the other one becomes shorter or longer in accordance with the opening and closing of the windowpane 2. Instead, the following configurations may be used. For example, the sensor electrode may be inclined so as to be located gradually closer to the position detecting electrode toward the lower side. Alternatively, the position detecting electrode may be inclined so as to be located gradually closer to the sensor electrode toward the upper side. These configurations may also have the same or corresponding advantage as the modified example of FIG. 3.

In the embodiment, when the controller 5 detects an increase in the electrostatic capacity of the sensor electrode 4 during the raising of the windowpane 2 started by the auto-up operation, the controller 5 lowers the windowpane 2 to free the entrapment. However, the lowering operation may be performed in a case other than during the raising of the windowpane 2 started by the auto-up operation. The controller 5 may lower the windowpane 2 to free the entrapment, for example, when the controller 5 detects an increase in the electrostatic capacity of the sensor electrode 4 during the raising of the windowpane 2 that is started by the manual operation.

The controller 5 does not necessarily have to lower the windowpane 2. For example, when the controller 5 detects an increase in she electrostatic capacity of the sensor electrode 4 during the raising of the windowpane 2 regardless of the auto-up operation and the manual operation, the controller 5 may stop the raising of the windowpane 2. In this case, the damage level of the object and/or the windowpane 2 caused by the entrapment is minimized.

In the embodiment, the controller 5 is electrically connected to the sensor electrode 4 and monitors the electrostatic capacity C of the sensor electrode 4 to detect whether or not entrapment occurs between the windowpane 2 and the window frame and also detect the position of the windowpane 2. However, the following configuration may be used. More specifically, the controller 5 may be electrically connected to the position detecting electrode 7 and monitor the electrostatic capacity C of the position detecting electrode 7 to detect whether or not entrapment occurs between the windowpane 2 and the window frame and also detect the position of the windowpane 2. Alternatively, the controller 5 may monitor the electrostatic capacity C of both the censor electrode 4 and the position detecting electrode 7 to detect whether or not entrapment occurs between the windowpane 2 and the window frame and also defect the position of the windowpane 2.

In the embodiment, the void portions 7a are arranged in the longitudinal direction of the position detecting electrode 7 to function as a plurality of local zones separated from each other by a fixed or predetermined distance. The conductivity or permittivity of the local zones differs from that of the remaining portion of the position detecting electrode 7. In the example of FIG. 1B, each void portion 7a has a lower conductivity than the remaining portion of the position detecting electrode 7.

The sensor electrode 4 may include the void portions 7a instead of the position detecting electrode 7. This configuration also generates a period of time in which the opposing area S is slowly increased and a period of time in which the opposing area S is quickly increased during the raising of the windowpane 2. More specifically, the rate of increase in the electrostatic capacity C is changed. This allows the controller 5 to detect the position of the windowpane 2.

In the embodiment, blocks formed from a material that differs in permittivity from the material of the position detecting electrode 7 may be arranged in the void portions 7a. This configuration may also have the same advantage as the advantage (2) of the embodiment.

In the embodiment, instead of the recesses, the void portions 7a may be a printed portion, a coating, or a film of a material that differs in permittivity from the material of the position detecting electrode 7 and is printed on, applied to, or attached to the position detecting electrode 7 at predetermined intervals in the vertical direction.

Alternatively, a material that differs in permittivity from the material of the position detecting electrode 7 may be printed on, applied to, or attached to a surface of the position detecting electrode 7 to form a printed portion, a coating, or a film so that the surface of the position detecting electrode 7 is exposed at predetermined intervals in the vertical direction and the exposed portions serve as the void portions 7a.

These configurations may also have the same advantage as the advantage (2) of the embodiment.

In the embodiment, the sensor electrode 4 may be arranged on the entire outer edge, which is the thickness-wise surface, of the windowpane 2.

In the embodiment, the sensor electrode 4 and the position detecting electrode 7 only need to be a conductive material. If is preferred that a wear resistant substance such as conductive robber be used as the sensor electrode 4.

The entrapment detection device of the embodiment may include the sensor electrode 4, the position detecting electrode 7, and the controller 5 and further include the motor 6. The entrapment detection device of the embodiment is used with the vehicle windowpane 2 and coupled to the power window 1. However, the entrapment detection device is applicable to various opening-closing bodies in addition to the windowpane 2. For example, the opening-closing body may open when the raising operation is performed and close when the lowering operation is performed such as a building shutter. The opening-closing body may pivot about a pivot shaft such as a swing door. The opening-closing body may open and close in the horizontal direction such as a vehicle sliding door or an automatic building sliding door.

The subject matter of the invention may lie in less than all features of a particular disclosed embodiment or modified example. The scope of the invention should be determined with reference to the appended claims, along with the full scope of equivalents to which such claims are entitled.

DESCRIPTION OF REFERENCE CHARACTERS 1) power window, 2) windowpane (opening-closing body), 4) sensor electrode, 5) controller (detection unit), 6) motor, 7, 9) position detecting electrode, 8) frame

The invention claimed is:

1. An entrapment detection device used with an opening-closing body movable in a movement direction, the entrapment detection device comprising:
a sensor electrode located on the opening-closing body;
a position detecting electrode arranged to be opposed to the sensor electrode, wherein an opposing area between the sensor electrode and the position detecting electrode is increased in accordance with movement of the opening-closing body in the movement direction; and
a detector configured to detect entrapment of an object from a change in electrostatic capacity of at least one of the sensor electrode and the position detecting electrode, and also detect a position of the opening-closing body from the change in electrostatic capacity,
wherein one of the sensor electrode and the position detecting electrode includes a plurality of void portions opposed to an other one of the sensor electrode and the position detecting electrode, and
the plurality of void portions is arranged in the movement direction of the opening-closing body.

2. The entrapment detection device according to claim 1, wherein one of the sensor electrode and the position detecting electrode is arranged to shorten a distance between the sensor electrode and the position detecting electrode in accordance with movement of the opening-closing body in the movement direction.

3. The entrapment detection device according to claim 1, wherein the sensor electrode includes a first elongated strip located on an end surface of the opening-closing body and including an outermost surface,
the position detecting electrode includes a second elongated strip extending in the movement direction and including an outermost surface facing the outermost surface of the first elongated strip,
the outermost surface of the second elongated strip includes a plurality of local zones discontinuously arranged in a longitudinal direction of the second elongated strip, and
conductivity or permittivity of each of the plurality of local zones differs from that of a remaining portion of the second elongated strip excluding the plurality of local zones.

4. The entrapment detection device according to claim 3, wherein the plurality of local zones is a row of a plurality of recesses, and
adjacent ones of the plurality of recesses are separated by a fixed or predetermined distance.

5. The entrapment detection device according to claim 3, wherein the detector is configured to count a number of times a changing rate of the electrostatic capacity is changed during uniform speed movement of the opening-closing body and determine a position of the opening-closing body based on the counted number.

6. The entrapment detection device according to claim 1, wherein the sensor electrode includes a first elongated strip located on an end surface of the opening-closing body and including an outermost surface,
the position detecting electrode includes a second elongated strip extending in the movement direction and including an outermost surface facing the outermost surface of the first elongated strip, and
the position detecting electrode is shaped so that the electrostatic capacity increases in an accelerated manner when the opening-closing body is moved at a uniform speed.

7. The entrapment detection device according to claim 6, wherein the outermost surfaces of the first and second elongated strips are separated by a distance that gradually changes in accordance with movement of the opening-closing body in the movement direction.

8. The entrapment detection device according to claim 6, wherein the position detecting electrode has a cross section extending in the movement direction, and the cross section is wedge-shaped.

9. The entrapment detection device according to claim 1, wherein when the opening-closing body is located in a movable range, the sensor electrode faces at least a portion of the position detecting electrode.

\* \* \* \* \*